(12) United States Patent
Matsumoto et al.

(10) Patent No.: US 7,364,806 B2
(45) Date of Patent: Apr. 29, 2008

(54) THERMAL BARRIER COATING SYSTEM METHOD OF MANUFACTURING THE SAME

(75) Inventors: Mineaki Matsumoto, Nagoya (JP); Norio Yamaguchi, Nagoya (JP); Kazushige Kimura, Nagoya (JP); Hideaki Matsubara, Nagoya (JP); Yasuo Matsunaga, Nagoya (JP); Kouichi Matsumoto, Chiyoda-ku (JP); Yasuhiro Shigegaki, Chiyoda-ku (JP); Takahito Araki, Chiyoda-ku (JP)

(73) Assignees: Japan Fine Ceramics Center (JP); Ishikawajima-Harima Heavy Industries Co., Ltd. (JP)

( * ) Notice: Subject to any disclaimer, the term of this patent is extended or adjusted under 35 U.S.C. 154(b) by 147 days.

(21) Appl. No.: 10/779,309

(22) Filed: Feb. 13, 2004

(65) Prior Publication Data

US 2005/0129972 A1     Jun. 16, 2005

(30) Foreign Application Priority Data

Feb. 17, 2003   (JP)   ............... 2003-038867
Feb. 5, 2004    (JP)   ............... 2004-029407

(51) Int. Cl.
*B32B 9/00*   (2006.01)

(52) U.S. Cl. ............ 428/701; 428/702; 428/469; 428/472; 416/241 B

(58) Field of Classification Search ............ 416/241 B, 416/241 R
See application file for complete search history.

(56) References Cited

U.S. PATENT DOCUMENTS

| | | | |
|---|---|---|---|
| 4,939,107 A * | 7/1990 | Ketcham | 501/103 |
| 5,876,860 A * | 3/1999 | Marijnissen et al. | 428/623 |
| 6,284,323 B1 | 9/2001 | Maloney | |
| 6,440,575 B1 | 8/2002 | Heimburg et al. | |
| 6,586,115 B2 | 7/2003 | Rigney et al. | |
| 6,790,486 B2 * | 9/2004 | Movchan et al. | 427/551 |
| 2002/0172838 A1 * | 11/2002 | Rigney et al. | 428/633 |
| 2003/0059633 A1 * | 3/2003 | Ackerman et al. | 428/472 |

FOREIGN PATENT DOCUMENTS

| | | |
|---|---|---|
| EP | 1 249 515 A2 | 10/2002 |
| EP | 1 295 965 A2 | 3/2003 |
| EP | 1 318 215 A3 | 6/2003 |
| EP | 1 375 701 A1 | 1/2004 |
| EP | 1 400 610 A1 | 3/2004 |
| EP | 1 304 397 A3 | 4/2004 |
| WO | WO 02/14580 A2 | 2/2002 |
| WO | WO 03/033986 A1 | 4/2003 |

OTHER PUBLICATIONS

Miller, et al., "Phase stability in plasma-sprayed, partially stabilized zirconia-yttria," *Science and Technology of Zirconia*, 3, p. 241-253.
Brandon, et al., "Phase stability of zirconia-based thermal barrier coatings Part I. Zirconia-yttria alloys," *Surface and Coatings Technology*, 46, p. 75-90 (1991).
Li, et al., "Effect of Dopants on Zirconia Stabilization- An X-ray Absorption Study: II, Tetravalent Dopants," *Journal of the American Ceramic Society*, 77(5), p. 1281-88 (1994).

* cited by examiner

*Primary Examiner*—Jennifer C. McNeil
*Assistant Examiner*—Timothy M. Speer
(74) *Attorney, Agent, or Firm*—Ostrolenk, Faber, Gerb & Soffen, LLP

(57) ABSTRACT

A thermal barrier coating system comprising a metal substrate, a metal bonding layer and a ceramics thermal barrier layer wherein the ceramics thermal barrier layer has a columnar structure of a stabilized zirconia containing a stabilizer or a stabilized $ZrO_2$—$HfO_2$ solid solution containing a stabilizer, and comprises 0.1 to 10 mol % of lanthanum oxide.

16 Claims, 4 Drawing Sheets

THERMAL BARRIER COATING SYSTEM METHOD OF MANUFACTURING THE SAME

BACKGROUND OF THE INVENTION

1. Field of the Invention

The present invention relates to a low thermally conductive thermal barrier coating system and to a method of manufacturing the same and, more particularly, relates to a low thermally conductive thermal barrier coating system which can effectively reduce the temperature of a metal substrate because its ceramics thermal barrier layer has low thermal conductivity, and which can exhibit excellent heat resistance and excellent durability for a long period when applied to high-temperature components such as gas turbine parts and jet engine parts, and relates to a method of manufacturing the same.

2. Description of the Related Art

In view of prevention of global warming caused by carbon dioxide gas emitted during combustion of a fossil fuels and improvement in economic efficiency by means of resource saving, further improvement in thermal efficiency is required for prime movers such as gas turbines and jet engines, and thus intensive research has been performed. In gas turbine power generating installations, it has been known that generating efficiency is further improved by the burner outlet gas temperature being raised by increasing the operating temperature. To enable operation at high temperature, metallic materials having high heat resistance has been continuously researched.

To improve durability (reliability) of the heat resisting metallic material, research has been conducted to improve heat resistance of the metallic material itself. For example, heat resistance superalloys made of a Ni-based alloy, a Co-based alloy, a Fe-based alloy or the like have intensively been studied as a structural material for high-temperature parts and various heat resistant superalloys have been put into pratical use.

However, high-temperature components made only of a superalloy of the prior art do not have sufficiently high melting point and are likely to cause softening and decrease in strength due to recrystallization in a high-temperature range, thus causing such fatal restriction that the members cannot be used at a high-temperature of 1000° C. or more.

As a remedy for the restriction, a thermal barrier coating (TBC: Thermal Barrier Coating) technique has been developed and put into practical use in part. The thermal barrier coating technique has a function of preventing temperature rise of a metal substrate by forming an oxide type ceramic layer having low thermal conductivity on the surface of the metal substrate to block heat.

FIG. 2 is a sectional view showing an example of configuration of a heat resisting structural member formed with the thermal barrier coating (TBC) of the prior art. The thermal barrier coating system shown in FIG. 2 has a three-layered structure composed generally of a metal substrate 1 made of a superalloy containing Ni, Co or Fe as a main component, a metal bonding layer 2 made of an MCrAlY (wherein that M is at least one kind of Ni, Co, Fe) alloy, platinum aluminide or the like having excellent corrosion resistance and excellent oxidation resistance formed on one surface of the metal substrate 1, and a ceramics thermal barrier layer (thermal barrier coating layer) 3 containing ceramics such as $Y_2O_3$ stabilized $ZrO_2$ as a main component. Ceramics layers are generally provided by a plasma spraying method.

Consequently, an operation and effect of suppressing temperature rise of the metal substrate 1 by a thermal barrier effect of the ceramics thermal barrier layer 3 can be obtained. The metal bonding layer 2 also exerts an effect of reducing thermal stress generated between the metal substrate 1 and the ceramics thermal barrier layer 3, preventing corrosion of the metal substrate 1 and suppressing oxidation.

However, the high-temperature component (heat resisting structural member) formed with a thermal barrier coating layer of the prior art had problems in that it was likely to cause cracking and spalling of the ceramics thermal barrier layer and was inferior in durability and reliability. It is considered that cracking and spalling of the ceramics thermal barrier layer are caused by differences in thermal expansion coefficient between the ceramic thermal barrier layer and the metal bonding layer, sintering and transformation of the ceramics thermal barrier layer, and volume expansion due to oxidation of the metal bonding layer.

Once cracking and spalling occur in the ceramics thermal barrier layer, thermal barrier properties drastically deteriorate, causing rapid temperature rise of the metal substrate. In the worst case, the metal substrate may be melted or broken. Such a risk should be avoided for operation of the equipment.

As a new method of forming a ceramics thermal barrier layer to be replaced by the plasma spraying method of the prior art, an electron beam physical vapor deposition (EB-PVD) method has attracted special interest recently. Since the ceramics thermal barrier layer synthesized by the EB-PVD method has a columnar structure including many longitudinal cracks and thermal stress can be reduced by deformation of the longitudinal crack portion, thermal shock resistance is noticeably improved.

However, the ceramics thermal barrier layer synthesized by the EB-PVD method had a problem in that it is inferior in thermal barrier effect to the conventional ceramics thermal barrier layer synthesized by the plasma spraying method because of its high thermal conductivity. In the case of the low thermal barrier effect, the temperature of the metal substrate increases and oxidation is accelerated, and thus spalling of the coating film is likely to occur. It is, therefore, considered that the EB-PVD film having low thermal conductivity leads to an improvement in properties of the thermal barrier coating.

As a finding with respect to providing the ceramics thermal barrier layer with low thermal conductivity, it is employed to provide a plurality of layers in the columnar structure (see, for example, Patent Document 1: Japanese Patent Application, First Publication No. Hei 11-256304 (page 1, FIGS. 1 to 6)). It is also reported to form a zig-zag pattern by controlling orientation of a columnar structure (see, for example, Patent Document 2: U.S. Pat. No. 6,455,173(B1) (page 1, FIGS. 2 to 3)). There is also a technical report that a low thermally conductive substance such as $Gd_2Zr_2O_7$ to be replaced by the partially stabilized $ZrO_2$ of the prior art is used as a constituent material of the ceramics thermal barrier layer (see, for example, Patent Document 3: U.S. Pat. No. 6,258,467 (page 1, FIG. 2)).

However, the use of a special deposition apparatus and a special technique is indispensable to control the texture of the ceramics thermal barrier layer so as to provide plural layers in the columnar structure, as disclosed in Patent Document 1, or to form a zig-zag pattern by controlling orientation of the columnar structure, as disclosed in Patent Document 2, and also there was drawbacks such as high equipment cost, high manufacturing cost and high operating cost of the equipment. Therefore, the above techniques are not suited for practical use. Even if low thermal conductivity is achieved by the technique, sintering occurs at high temperature and nanopores or gaps, which are effective to achieve low thermal conductivity, disappear, resulting in high thermal conductivity.

As disclosed in Patent Document 3, when the low thermally conductive substance such as $Gd_2Zr_2O_7$ to be replaced by the stabilized $ZrO_2$ of the prior art is used as the constituent material of the ceramics thermal barrier layer, the low thermally conductive substance is inferior in mechanical properties such as erosion resistance and effective means for overcoming the problem and achieving low thermal conductivity has never been established. In the case in which the thermal barrier coating system is applied to high-temperature components such as gas turbine parts and jet engine parts, when spalling of the ceramics thermal barrier layer occurs, thermal barrier properties drastically deteriorate, causing rapid temperature rise of the metal substrate, and thus the member is melted or broken, resulting in a serious obstacle during operation of the equipment.

In actual gas turbine parts, for example, turbine blade, cooling gas holes having a size of about $\phi$ 1 mm is provided on the surface of a blade and a cooling gas is ejected from the inside of the blade, thereby suppressing the temperature from rising. In the case in which a thermal barrier layer is formed by thermal spraying, since the cooling holes are covered with the thermal spraying material, it is necessary to do further steps such as forming the cooling holes again after coating. In the case in which an EB-PVD process is applied to a conventional material to form a thermal barrier layer, although the cooling holes are not completely covered, the coating material is deposited around the opening portion, thereby causing problems in that the amount of the cooling gas decreases and satisfactory cooling properties cannot be obtained.

SUMMARY OF THE INVENTION

The present invention has been made to solve the above problems of the prior art and an object thereof is to provide a thermal barrier coating system which improves thermal barrier properties and suppresses deterioration due to sintering by imparting low thermal conductivity to a ceramics thermal barrier layer synthesized by an EB-PVD method, and which can exhibit excellent heat resistance and excellent durability for a long period when applied to high-temperature components such as gas turbine parts and jet engine parts, and a method of manufacturing the same.

A first aspect of the present invention is a thermal barrier coating system comprising a metal substrate, a metal bonding layer, and a ceramics thermal barrier layer formed on the surface of the metal substrate via the metal bonding layer by an electron beam physical vapor deposition method, wherein the ceramics thermal barrier layer has a columnar structure of a stabilized zirconia containing a stabilizer, and also contains 0.1 to 10 mol % of lanthanum oxide.

A second aspect of the present invention is a thermal barrier coating system comprising a metal substrate, a metal bonding layer, and a ceramics thermal barrier layer formed on the surface of the metal substrate via the metal bonding layer by an electron beam physical vapor deposition method, wherein the ceramics thermal barrier layer has a columnar structure of stabilized zirconia-hafnia solid solution containing a stabilizer, and also contains 0.1 to 10 mol % of lanthanum oxide.

A third aspect of the present invention is a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, simultaneously melting two kinds of raw materials which are a stabilized $ZrO_2$ deposition material and a La-based composite oxide deposition material by an electron beam physical vapor deposition method, and depositing the resulting mixed vapor on the surface of the metal bonding layer to form the ceramics thermal barrier layer.

A fourth aspect of the present invention is a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, simultaneously melting two kinds of raw materials which are a stabilized $ZrO_2$—$HfO_2$ and a La-based composite oxide deposition material by an electron beam physical vapor depositionmethod, and depositing the resulting mixed vapor on the surface of the metal bonding layer to form the ceramics thermal barrier layer.

A fifth aspect of the present invention is a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, melting a composite oxide deposition material, which is obtained by adding $La_2O_3$ to a stabilized $ZrO_2$, by an electron beam physical vapor deposition method, and depositing the resulting raw material vapor on the surface of the metal bonding layer to form the ceramics thermal barrier layer.

A sixth aspect of the present invention is a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, melting a composite oxide deposition material, which is obtained by adding $La_2O_3$ to stabilized $ZrO_2$—$HfO_2$, by an electron beam physical vapor deposition method, and depositing the resulting raw material vapor on the surface of the metal bonding layer to form the ceramics thermal barrier layer.

DETAILED DESCRIPTION OF THE PREFERRED EMBODIMENT

To achieve the aforementioned object, the present inventors have fabricated thermal barrier coating systems by forming ceramics thermal barrier layers having various compositions and structures, and researched the influence of the composition and structure of various ceramics thermal barrier layers on thermal conductivity by comparing the results. As a result, they have found that, in the case in which the ceramics thermal barrier layer contains 0.1 to 20 mol % of lanthanum (La), preferably 0.1 to 10 mol % of lanthanum oxide ($La_2O_3$), low thermal conductivity is effectively imparted to the ceramics thermal barrier layer, thereby obtaining a thermal barrier coating system having excellent heat resistance and excellent durability. The present invention has been completed based on the above finding.

In one aspect, the thermal barrier coating system of the present invention comprises a metal substrate, a metal bonding layer, and a ceramics thermal barrier layer formed on the surface of the metal substrate via the metal bonding layer by an electron beam physical vapor deposition (EB-PVD) method, wherein the ceramics thermal barrier layer has a columnar structure of a stabilized zirconia ($ZrO_2$) containing a stabilizer, and also contains 0.1 to 20 mol % of lanthanum (La), preferably 0.1 to 10 mol % of lanthanum oxide ($La_2O_3$).

Lanthanum oxide ($La_2O_3$) is a component, which is incorporated to suppress sintering of the ceramics thermal barrier layer and to reduce thermal conductivity, and is incorporated in an amount of 0.1 to 10 mol %. When the content is less than 0.1 mol %, less effect of reducing the thermal conductivity is exerted. Even if lanthanum oxide is added in excess amount of more than 10 mol %, the effect of reducing the thermal conductivity is saturated and a large amount of a pyrochlore phase ($La_2Zr_2O_7$) having poor thermal shock resistance tends to be often produced.

In another aspect, the thermal barrier coating system of the present invention comprises a metal substrate, a metal bonding layer, and a ceramics thermal barrier layer formed on the surface of the metal substrate via the metal bonding layer by an electron beam physical vapor deposition (EB-PVD) method, wherein the ceramics thermal barrier layer has a columnar structure of stabilized zirconia-hafnia ($ZrO_2$—$HfO_2$) solid solution containing a stabilizer, and also contain 0.1 to 10 mol % of lanthanum oxide ($La_2O_3$).

$HfO_2$ and $ZrO_2$ form a complete solid solution. Since $HfO_2$ has high melting point, the heat resistance is more improved as the content increases. Higher content decreases a thermal expansion coefficient of the ceramics thermal barrier layer, thereby deteriorating the thermal shock resistance. Preferable ratio Hf/Zr is 0.5 or less.

The stabilizer contained in the ceramics thermal barrier layer is preferably any one selected from the group consisting of yttrium oxide ($Y_2O_3$), erbium oxide ($Er_2O_3$), gadolinium oxide ($Gd_2O_3$), ytterbium oxide ($Yb_2O_3$), neodymium oxide ($Nd_2O_3$), praseodymium oxide ($Pr_2O_3$), cerium oxide ($CeO_2$) and scandium oxide ($Sc_2O_3$), or a mixture of these oxides. More preferable oxides are $Y_2O_3$, $Gd_2O_3$ and $Er_2O_3$.

The amount of the stabilizer $M_2O_3$ (M is at least one kind of Y, Er, Gd, Yb, Nd, Pr, Ce and Sc) to be added is preferably within a range from 3 to 15 mol %, and $ZrO_2$ or a $ZrO_2$—$HfO_2$ solid solution, which has excellent phase stability, can be obtained within the above range.

The composition of the thermal barrier coating layer comprising $ZrO_2$ or a $ZrO_2$—$HfO_2$ solid solution, which contains the stabilizer, and $La_2O_3$ is represented by "$(Zr_xHf_{1-x})O_2$-3 to 15 mol % $M_2O_3$ (M is at least one kind of Y, Er, Gd, Yb, Ce, Nd, Pr and Sc)-0.05 to 10 mol % $La_2O_3$", and is represented by the following general formula.

That is, the composition of the ceramics thermal barrier layer is represented by the general formula: $(Zr_\alpha Hf_{1-\alpha})O_2$-$\beta$ mol % ($M_2O_3$)-$\gamma$ mol % ($La_2O_3$) (wherein M is an element constituting the stabilizer and is at least one element selected from Y, Er, Gd, Yb, Ce, Nd, Pr and Sc, and $\alpha$, $\beta$ and $\gamma$ are coefficients) and the coefficients $\alpha$, $\beta$ and $\gamma$ satisfy the relations: $0.05 < \alpha < 1$, $3 \leq \beta \leq 15$, and $0.1 \leq \gamma \leq 10$.

When the ceramics thermal barrier layer is formed by adjusting each amount of stabilizer, $ZrO_2$, $HfO_2$ and $La_2O_3$ so as to satisfy the above respective relations, it is made possible to obtain a thermal barrier coating system which has low thermal conductivity and also has excellent sintering resistance and excellent phase stability.

The thermal barrier coating system of the present invention comprises a metal substrate, a metal bonding layer, and a ceramics thermal barrier layer formed on the surface of the metal substrate via the metal bonding layer, the ceramics thermal barrier layer comprising a plurality of columnar grains, each extending vertically to the surface of the metal substrate. The columnar grain has an orientation in the direction of the (100) or (001) plane relative to the substrate. The columnar grain has a structure wherein fine laminar or bar-shaped protrusions, or combined structures (subgrains) are formed on the surface (feather-like structures) and plural fine pores each having a size of 100 nm or less are dispersed therein. In the ceramics thermal barrier layer, a volume fraction of pores included in the ceramics thermal barrier layer is preferably from 10% to 50%. The volume fraction of pores is obtained by the total volume of gaps between the columnar grains, fine gaps between protrusions (subgrains) of the surface of the columnar grain, pores and the like included in the columnar grain. When the porosity is less than 10%, less effect of reducing the thermal conductivity of the ceramics thermal barrier layer is exerted. On the other hand, the porosity exceeds 50%, the structural strength of the ceramics thermal barrier layer decreases. Therefore, the porosity is preferably within a range from 10 to 50%, and more preferably from 20 to 40%. The porosity can be measured by image analysis of an enlarged electron micrograph of a sectional structure of the ceramics thermal barrier layer.

In the thermal barrier coating system, the metal bonding layer is preferably made of an MCrAlY alloy (wherein that M is at least one kind of metal selected from Ni, Co, Fe, and an alloy thereof) or platinum aluminide.

In the thermal barrier coating system, the metal substrate, on which the ceramics thermal barrier layer is formed via the metal bonding layer, comprises gas turbine parts. In the thermal barrier coating system, the gas turbine parts is preferably a turbine blade, a turbine nozzle vane or combustion chamber parts. According to the present invention, there is provided a thermal barrier coating system suited for use as gas turbine parts (gas turbine engine parts) such as turbine blade and combustion chamber parts.

The method of manufacturing a thermal barrier coating system of the present invention is directed to a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, simultaneously melting two kinds of raw materials consisting of a stabilized $ZrO_2$ deposition material and a La-based composite oxide deposition material by an electron beam physical vapor deposition (EB-PVD) method, and depositing the resulting mixed vapor on the surface of the metal bonding layer to form the ceramics thermal barrier layer.

The method of manufacturing a thermal barrier coating system of the present invention is directed to a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, simultaneously melting two kinds of raw materials such as stabilized $ZrO_2$—$HfO_2$ and a La-based composite oxide deposition material by an electron beam physical vapor deposition (EB-PVD) method, and depositing the resulting mixed vapor on the surface of the metal bonding layer to form the ceramics thermal barrier layer.

In the respective methods described above, the La-based composite oxide is preferably any oxide containing La, and is more preferably $La_2Zr_2O_7$ or $La_2Hf_2O_7$.

The method of manufacturing a thermal barrier coating system of the present invention is directed to a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, melting a composite oxide deposition material, which is obtained by adding $La_2O_3$ to stabilized $ZrO_2$, by an electron beam physical vapor deposition (EB-PVD) method, and depositing the resulting raw material vapor on the surface of the metal bonding layer to form the ceramics thermal barrier layer.

The method of manufacturing a thermal barrier coating system of the present invention is directed to a method of manufacturing a thermal barrier coating system comprising a metal substrate, a metal bonding layer, and a ceramics thermal barrier layer formed integrally on the surface of the metal substrate via the metal bonding layer, which comprises forming the metal bonding layer on the surface of the metal substrate, melting a composite oxide deposition material, which is obtained by adding $La_2O_3$ to stabilized $ZrO_2$—$HfO_2$, by an electron beam physical vapor deposition (EB-PVD) method, and depositing the resulting raw material vapor on the surface of the metal bonding layer to form the ceramics thermal barrier layer.

As described above, according to the low thermally conductive thermal barrier coating system and the method of manufacturing the same according to the present invention, since the ceramics thermal barrier layer has a columnar structure of $ZrO_2$ or $ZrO_2$—$HfO_2$ containing a stabilizer, and also contains a predetermined amount of $La_2O_3$, the thermal conductivity of the thermal barrier coating layer can be effectively reduced, furthermore, sintering is suppressed and increase in thermal conductivity at high temperature can be suppressed. Therefore, oxidation can be suppressed by reducing the temperature of the metal substrate, thus making it possible to markedly enhance thermal barrier properties and durability of the thermal barrier coating system. When the thermal barrier coating system of the present invention is applied to high-temperature components such as gas turbine parts and jet engine parts, it is made possible to improve properties by extending the lifetimes of the high-temperature components and to markedly improve reliability and durability of the equipment using the high-temperature components.

DESCRIPTION OF PREFERRED EMBODIMENTS

Embodiments of the present invention will be described in more detail with reference to the accompanying drawings. The present invention is not limited to the following embodiments and other modifications can be made without departing from the scope of the present invention.

Figure 1:
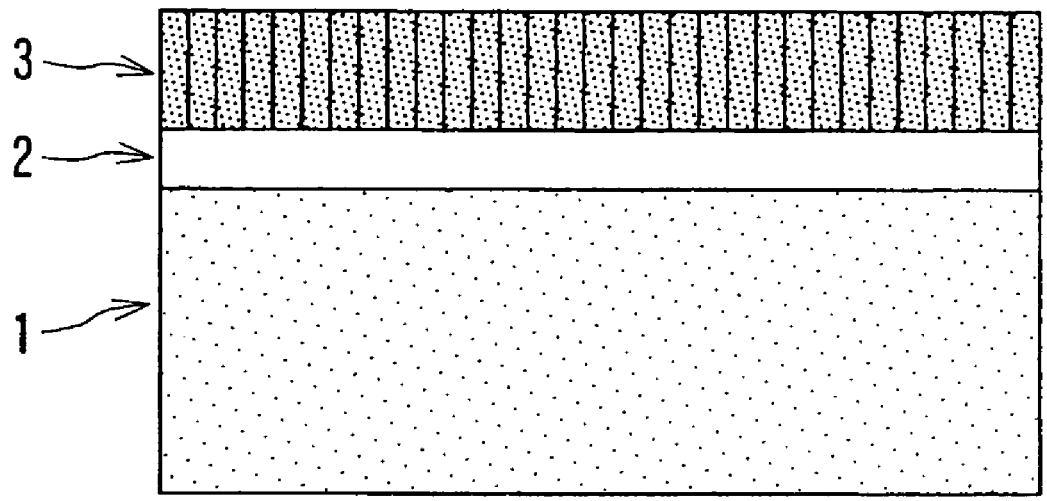
FIG. 1 is a sectional view showing a configuration of an example of a thermal barrier coating system comprising a ceramics thermal barrier layer formed by an EB-PVD method of the present invention.

The thermal barrier coating system of the present invention has a three-layered structure shown in FIG. 1. First, a metal bonding layer 2 as a second layer is formed so as to coat a metal substrate 1 as a first layer. The metal bonding layer 2 is made of an MCrAlY alloy (wherein that M is an element of Ni, Co or Fe, or an alloy thereof) or platinum aluminide. On the surface of the metal bonding layer 2, a thermal barrier coating layer (ceramics thermal barrier layer) 3 is formed and the ceramics thermal barrier layer 3 is made of stabilized $ZrO_2$ or stabilized $ZrO_2$—$HfO_2$, and also contains 0.1 to 10 mol % of $La_2O_3$.

Although the metal substrate 1 is not specifically limited, Ni-based superalloys such as Inconel 738, Co alloys such as MarM509, and heat resisting alloys such as stainless steel, which are used as a constituent material of gas turbine parts, can be widely applied for the present invention.

The metal bonding layer 2 firmly joins the metal substrate 1 to the thermal barrier coating layer 3, and also exhibits an action of eliminating the influence of a difference in thermal expansion coefficient between the metal substrate 1 and the thermal barrier coating layer 3, thereby reducing thermal stress generated between the two. The material constituting the metal bonding layer 2 is preferably an MCrAlY alloy (wherein that M is at least one kind of metal of Ni, Co and Fe) or platinum aluminide in view of excellent corrosion resistance, excellent oxidation resistance and excellent heat resistance to the metal substrate 1 and thermal barrier coating layer 3.

The metal bonding layer 2 is made of the MCrAlY alloy, the above alloy components are deposited in the form of a film on the surface of the metal substrate 1 by a thermal spraying method such as low pressure plasma spraying method, or a physical vapor deposition (PVD) method. In the case in which the metal bonding layer is made of platinum aluminide, a metal bonding layer 2 made of platinum aluminide is formed on the metal substrate 1 by a diffusion treatment of Al after Pt plating.

The thickness of the metal bonding layer 2 is preferably within a range from 50 to 200 μm. When the thickness of the metal bonding layer 2 is less than 50 μm, the effect of reducing thermal stress becomes insufficient. On the other hand, when the thickness exceeds 200 μm, the effect is saturated and the time required to form the metal bonding layer in the form of a film increases. Therefore, the thickness of the metal bonding layer 2 is preferably set within a range from 50 to 200 μm, and more preferably from 50 to 120 μm.

On the surface of the metal bonding layer 2, a thermal barrier coating layer 3 is formed. In proportion to the thickness of the thermal barrier coating layer, a thermal barrier effect increases. When the thickness is too large, spalling is likely to occur. On the other hand, when the layer is thin, less thermal barrier effect is exerted. Therefore, the thickness is preferably set within a range from 50 to 800 μm, and more preferably from 100 to 500 μm.

According to the low thermally conductive thermal barrier coating system and the method of manufacturing the same, since the ceramics thermal barrier layer has a columnar structure of $ZrO_2$ or a $ZrO_2$—$HfO_2$ solid solution, which contains a stabilizer, and also contain a predetermined amount of $La_2O_3$, the thermal conductivity of the thermal barrier coating layer can be effectively reduced and oxidation can be suppressed by reducing the temperature of the metal substrate, thus making it possible to markedly enhance thermal barrier properties and durability of the thermal barrier coating system. Therefore, when the thermal barrier coating system of the present invention is applied to high-temperature components such as gas turbine parts and jet engine parts, it is made possible to improve properties by extending the lifetimes of the high-temperature components and to markedly improve reliability and durability of the equipment using the high-temperature components.

EXAMPLES

Example 1

In Example 1, a thermal barrier coating system having a structure shown in FIG. 1 of Example 1 was manufactured by forming a metal bonding layer 2 (thickness: 100 μm) made of a NiCoCrAlY alloy on the surface of a plate-shaped metal substrate 1 made of a superalloy (HS-188) by a low pressure plasma spraying method, and forming a thermal barrier coating layer 3 (thickness: about 300 μm, porosity: about 25%) having orientation in the (001) direction on the surface of the metal bonding layer 2 by an electron beam physical vapor deposition method (EB-PVD method) using a $ZrO_2$-4 mol % (7 mass %)$Y_2O_3$ deposition material containing 5 mol % of $La_2O_3$ as a raw material.

Example 2

In Example 2, a thermal barrier coating system of Example 2 was manufactured by forming a metal bonding layer 2 (thickness: 100 μm) made of a NiCoCrAlY alloy on the surface of the same metal substrate 1 as that used in Example 1 by a low pressure plasma spraying method, and forming a thermal barrier coating layer 3 (thickness: about 300 μm, porosity: about 25%) having orientation in the (001) direction on the surface of the metal bonding layer 2 by an EB-PVD method using a $(Zr_{0.75}Hf_{0.25})O_2$-4 mol % (7 mass %)$Y_2O_3$ deposition material containing 5 mol % of $La_2O_3$ as a raw material.

Example 3

In Example 3, a thermal barrier coating system of Example 3 was manufactured by forming a metal bonding layer 2 (thickness: 100 μm) made of a NiCoCrAlY alloy on the surface of the same metal substrate 1 as that used in Example 1 by a low pressure plasma spraying method, and forming a thermal barrier coating layer 3 (thickness: about 300 μm, porosity: about 25%) having orientation in the (001) direction on the surface of the metal bonding layer 2 by an EB-PVD method using a $(Zr_{0.5}Hf_{0.5})O_2$-4 mol % (7 mass %)$Y_2O_3$ deposition material containing 5 mol % of $La_2O_3$ as a raw material.

Example 4

In Example 4, a thermal barrier coating system of Example 4 was manufactured by forming a metal bonding layer 2 (thickness: 100 μm) made of a NiCoCrAlY alloy on the surface of the same metal substrate 1 as that used in Example 1 by a low pressure plasma spraying method, and forming a thermal barrier coating layer 3 (thickness: about 300 μm, porosity: about 25%) having orientation in the (001) direction on the surface of the metal bonding layer 2 by an EB-PVD method using a $(Zr_{0.25}Hf_{0.75})O_2$-4 mol % (7 mass %)$Y_2O_3$ deposition material containing 5 mol % of $La_2O_3$ as a raw material.

Example 5

In Example 5, a thermal barrier coating system having a structure shown in FIG. 1 of Example 1 was manufactured by forming a metal bonding layer 2 (thickness: 100 μm) made of a NiCoCrAlY alloy on the surface of a plate-shaped metal substrate 1 made of a superalloy (HS-188) by a low pressure plasma spraying method, and forming a thermal barrier coating layer 3 (thickness: about 300 μm, porosity: about 25%) having orientation in the (001) direction on the surface of the metal bonding layer 2 by an electron beam physical vapor deposition method (EB-PVD method) using a $ZrO_2$-4 mol % (7 mass %)$Y_2O_3$ deposition material containing 2 mol % of $La_2O_3$ as a raw material.

Example 6

In Example 6, a thermal barrier coating system having a structure shown in FIG. 1 of Example 1 was manufactured by forming a metal bonding layer 2 (thickness: 100 μm) made of a NiCoCrAlY alloy on the surface of a plate-shaped metal substrate 1 made of a superalloy (HS-188) by a low pressure plasma spraying method, and forming a thermal barrier coating layer 3 (thickness: about 300 μm, porosity: about 25%) having orientation in the (001) direction on the surface of the metal bonding layer 2 by an electron beam physical vapor deposition method (EB-PVD method) using a $ZrO_2$-4 mol % (7 mass %)$Y_2O_3$ deposition material containing 10 mol % of $La_2O_3$ as a raw material.

Example 7

In Example 7, a thermal barrier coating system of Example 7 was manufactured by forming a metal bonding layer 2 (thickness: 100 μm) made of a NiCoCrAlY alloy on the surface of the same metal substrate 1 as that used in Example 1 by a low pressure plasma spraying method, and forming a thermal barrier coating layer 3 (thickness: about 300 μm, porosity: about 25%) having orientation in the (001) direction on the surface of the metal bonding layer 2 by an EB-PVD method using two kinds of deposition materials, which were a $ZrO_2$-4 mol % (7 mass %)$Y_2O_3$ deposition material and a $La_2Zr_2O_7$ deposition material, as a raw material.

Example 8

In Example 8, a thermal barrier coating system of Example 8 was manufactured by forming a metal bonding layer 2 (thickness: 100 μm) made of a NiCoCrAlY alloy on the surface of the same metal substrate 1 as that used in Example 1 by a low pressure plasma spraying method, and forming a thermal barrier coating layer 3 (thickness: about 300 μm, porosity: about 25%) having orientation in the (001) direction on the surface of the metal bonding layer 2 by an EB-PVD method using a $ZrO_2$-4 mol % (7 mass %)$Er_2O_3$ deposition material containing 5 mol % of $La_2O_3$ as a raw material.

Comparative Example 1

In Comparative Example 1, a thermal barrier coating system of Comparative Example 1 was manufactured by forming a metal bonding layer 2 (thickness: 100 μm) made of a NiCoCrAlY alloy on the surface of the same metal substrate 1 as that used in Example 1 by a low pressure plasma spraying method, and forming a thermal barrier coating layer 4 (thickness: about 300 μm, porosity: about 25%) having orientation in the (001) direction on the surface of the metal bonding layer 2 by an EB-PVD method using a $ZrO_2$-4 mol % (7 mass %)$Y_2O_3$ deposition material containing no La component as a raw material.

Comparative Example 2

In Comparative Example 2, a thermal barrier coating system of Comparative Example 2 was manufactured by forming a metal bonding layer 2 (thickness: 100 μm) made of a NiCoCrAlY alloy on the surface of the same metal substrate 1 as that used in Example 1 by a low pressure plasma spraying method, and forming a thermal barrier coating layer 4 (thickness: about 300 μm, porosity: about 20%) on the surface of the metal bonding layer 2 by an atmospheric plasma spraying (APS) method using a $ZrO_2$-4 mol % (7 mass %)$Y_2O_3$ powder containing no La component as a raw material.

Comparative Example 3

Figure 2:
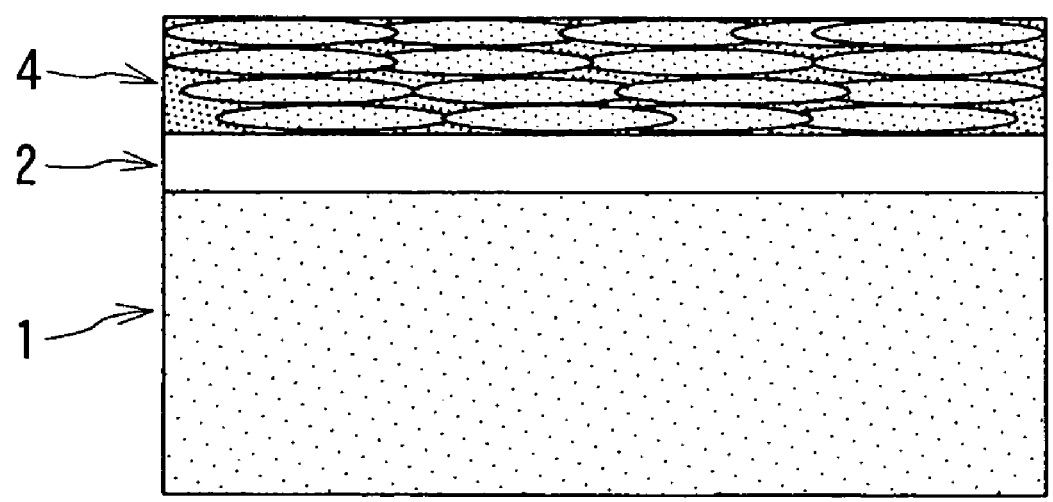
FIG. 2 is a sectional view showing a configuration of a thermal barrier coating system comprising a ceramics thermal barrier layer formed by a spraying method of the prior art.

In Comparative Example 3, a thermal barrier coating system having a structure shown in FIG. 2 of Comparative Example 3 was manufactured by forming a metal bonding layer 2 (thickness: 100 μm) made of a NiCoCrAlY alloy on the surface of a plate-shaped metal substrate 1 made of a superalloy (HS-188) by a low pressure plasma spraying method, and forming a thermal barrier coating layer 4 (thickness: about 300 μm, porosity: about 25%) having orientation in the (001) direction on the surface of the metal bonding layer 2 by an electron beam physical vapor deposition method (EB-PVD method) using a $ZrO_2$-4 mol % (7 mass %)$Y_2O_3$ deposition material containing 15 mol % of $La_2O_3$ as a raw material.

Comparative Example 4

In Comparative Example 4, a thermal barrier coating system having a structure shown in FIG. 2 of Comparative Example 4 was manufactured by forming a metal bonding layer 2 (thickness: 100 μm) made of a NiCoCrAlY alloy on the surface of a plate-shaped metal substrate 1 made of a superalloy (HS-188) by a low pressure plasma spraying method, and forming a thermal barrier coating layer 4 (thickness: about 300 μm, porosity: about 25%) having orientation in the (001) direction on the surface of the metal bonding layer 2 by an electron beam physical vapor deposition method (EB-PVD method) using a $ZrO_2$-1.5 mol % (2.7 mass %)$Y_2O_3$ deposition material containing 5 mol % of $La_2O_3$ as a raw material.

Evaluation Tests

By subjecting samples of the resulting thermal barrier coating systems of the respective Examples and Comparative Examples to a burner rig test, thermal shock properties of the respective thermal barrier coating systems were evaluated. In the burner rig test, a heating-cooling cycle comprising an operation of heating the side of a thermal barrier coating layer so that the surface temperature becomes 1300° C. while cooling the bottom of a metal substrate of a thermal barrier coating system, as a high-temperature component, for one hour and an operation of cooling for 10 minutes was repeated, and then thermal cycle lifetime was determined by measuring the number of cycles until spalling of the thermal barrier coating layer and durability and reliability of the respective thermal barrier coating systems were evaluated. The results of the burner rig test are shown in Table 1.

TABLE 1

| | Ratio Hf/Zr | Stabilizer | Amount of $La_2O_3$ added | Formation method | Thermal cycle life |
|---|---|---|---|---|---|
| Example 1 | — | $Y_2O_3$ (4 mol %) | 5 mol % | EB-PVD (1 deposition material) | >490 |
| Example 2 | 0.25 | $Y_2O_3$ (4 mol %) | 5 mol % | EB-PVD (1 deposition material) | >500 |
| Example 3 | 0.5 | $Y_2O_3$ (4 mol %) | 5 mol % | EB-PVD (1 deposition material) | 410 |
| Example 4 | 0.75 | $Y_2O_3$ (4 mol %) | 5 mol % | EB-PVD (1 deposition material) | 350 |
| Example 5 | — | $Y_2O_3$ (4 mol %) | 2 mol % | EB-PVD (1 deposition material) | 451 |
| Example 6 | — | $Y_2O_3$ (4 mol %) | 10 mol % | EB-PVD (1 deposition material) | 340 |
| Example 7 | — | $Y_2O_3$ (4 mol %) | 5 mol % | EB-PVD (2 deposition materials) | >500 |
| Example 8 | — | $Er_2O_3$ (4 mol %) | 5 mol % | EB-PVD (1 deposition material) | >500 |
| Comparative Example 1 | — | $Y_2O_3$ (4 mol %) | — | EB-PVD (1 deposition material) | 210 |
| Comparative Example 2 | — | $Y_2O_3$ (4 mol %) | — | APS | 51 |

TABLE 1-continued

| | Ratio Hf/Zr | Stabilizer | Amount of $La_2O_3$ added | Formation method | Thermal cycle life |
|---|---|---|---|---|---|
| Comparative Example 3 | — | $Y_2O_3$ (4 mol %) | 15 mol % | EB-PVD (1 deposition material) | 181 |
| Comparative Example 4 | — | $Y_2O_3$ (1.5 mol %) | 5 mol % | EB-PVD (1 deposition material) | 30 |

As is apparent from the results shown in Table 1, thermal cycle life was markedly improved in the case of the thermal barrier coating systems provided with a ceramics thermal barrier layer containing a predetermined amount of $La_2O_3$ of the respective Examples. On the other hand, thermal cycle life is reduced in the case of the thermal barrier coating systems provided with a ceramics thermal barrier layer 4, which does not contain $La_2O_3$ and is made only of stabilized zirconia, of Comparative Examples 1 and 2.

As is apparent from the results obtained by comparing Examples 2, 3 and 4, a ratio Zr/Hf is preferably set to 0.5 or less. As is apparent from the results obtained by comparing Example 1, 5 and 6 with Comparative Example 3, the amount of $La_2O_3$ to be added is preferably 10 mol % or less. Furthermore, the result of Comparative Example 4 shows that when the amount of $Y_2O_2$ as a stabilizer is 3 mol % or less, the stability of the obtained phase becomes poor and many monoclinic crystals are formed and thermal cycle life is decreased.

Figure 3:
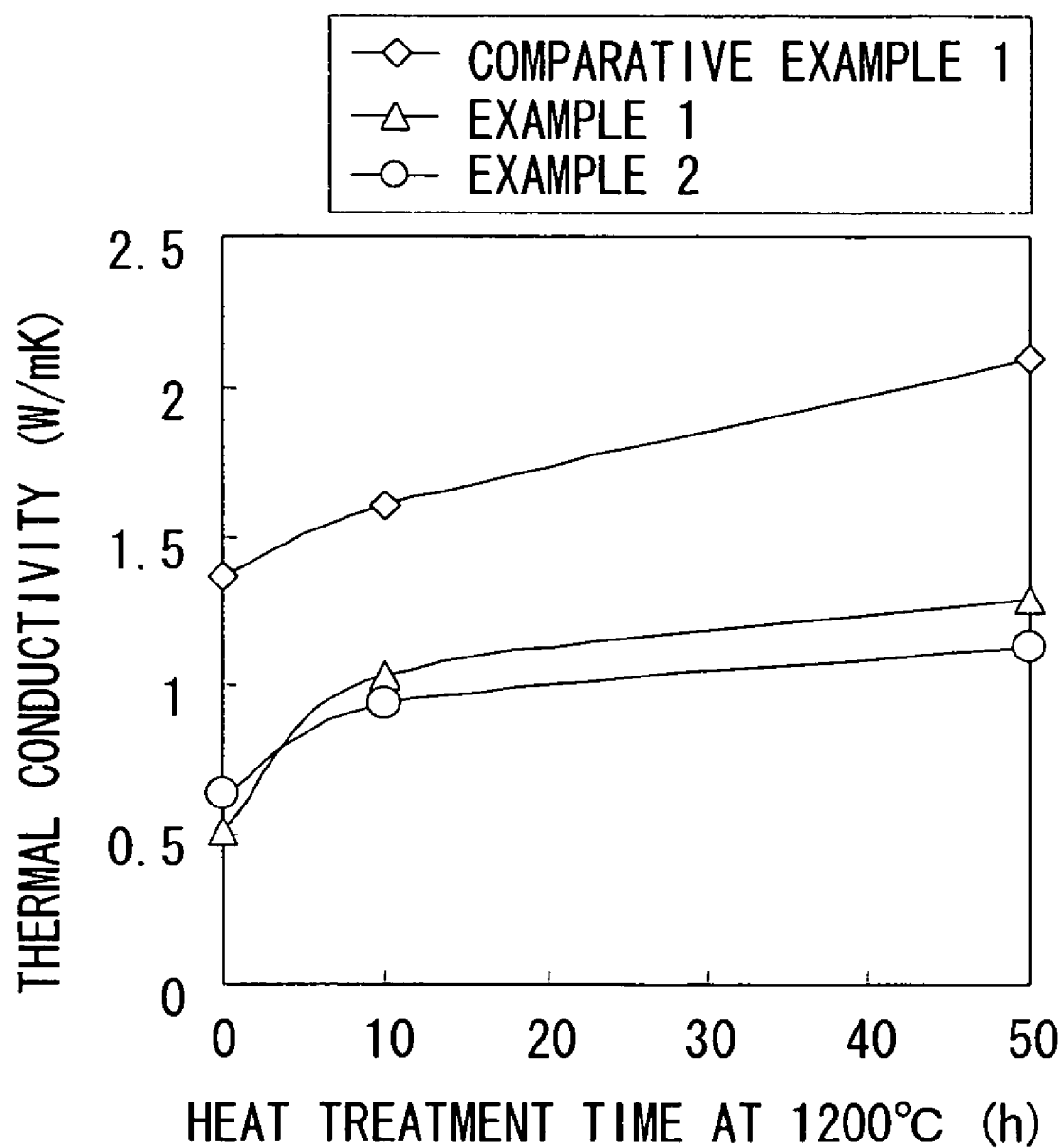
FIG. 3 is a graph showing the results obtained by measuring thermal conductivity of a ceramics thermal barrier layer of thermal barrier coating systems of Example 1 and Comparative Example 1 after being subjected to a heat treatment at 1200° C. for 0 to 50 hours.

FIG. 3 is a graph showing the results obtained by measuring a thermal conductivity of thermal barrier coating systems of Example 1 and Comparative Example 1 after being subjected to a heat treatment at a temperature of 1200° C. for 0 to 50 hours. As is apparent from the results shown in FIG. 3, initial thermal conductivity can be markedly reduced by adding $La_2O_3$ and also an increase in thermal conductivity can be effectively suppressed even when subjected to a heat treatment for a long time. It is considered that an increase in thermal conductivity at high temperature is caused by densification as a result of sintering of the ceramics thermal barrier layer. Since $La_2O_3$ also has an effect of suppressing sintering, an increase in thermal conductivity at high temperature can be suppressed and low thermal conductivity of the film can be maintained. Furthermore, the heat and sintering resistance can be improved by substituting a portion of $ZrO_2$ with $HfO_2$ and thus an increase in thermal conductivity can be suppressed.

Figure 4A:
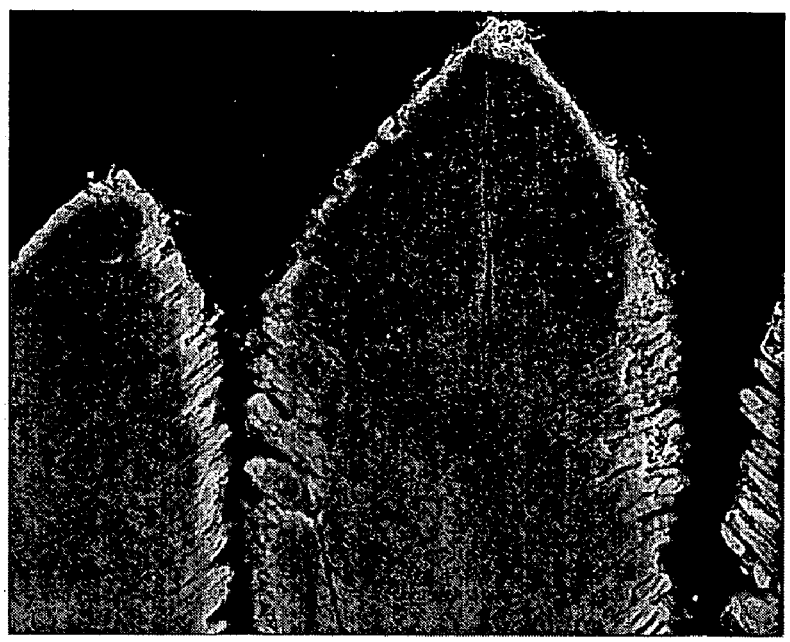
FIG. 4A is an electron micrograph showing a texture of a ceramics thermal barrier layer of Comparative Example 1.
Figure 4B:
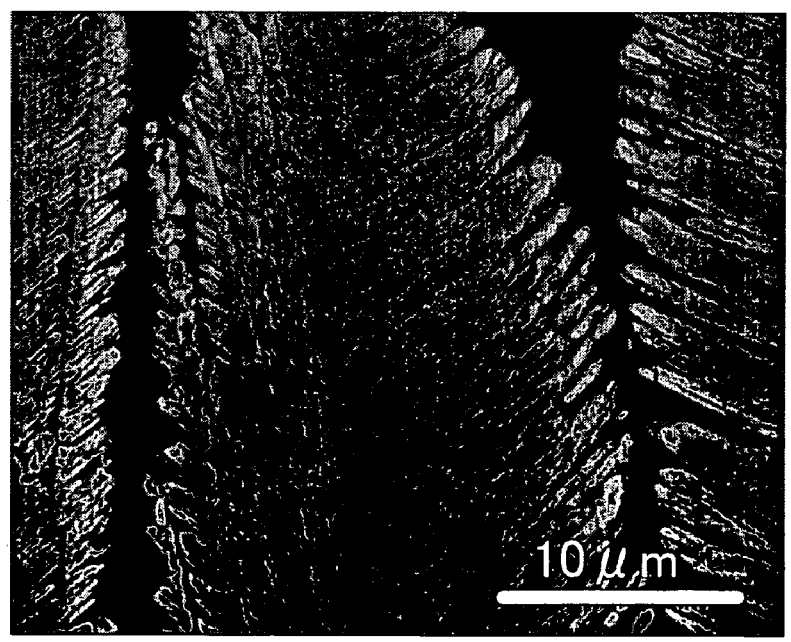
FIG. 4B is an electron micrograph showing a texture of a ceramics thermal barrier layer of Example 1.

FIGS. 4A and 4B are electron micrographs showing a comparison in texture of a ceramics thermal barrier layer of a thermal barrier coating system between Example 1 and Comparative Example 1. In Example 1, it is apparent that a large amount of a feather-like structure is introduced into a columnar grain of a thermal barrier layer by the addition of $La_2O_3$. It is believed that reduction in thermal conductivity is mainly caused by introduction of defects such as feather-like structures and nanopores. The other possible reason for the reduction in thermal conductivity is the introduction of vacancies and strain fields by $La_2O_3$ addition. $La_2O_3$ was dissolved in the matrix and created oxygen vacancies to maintain the electrical neutrality of the lattice. La ions also introduced strain fields as well as vacancies into the lattice, both of which would lower thermal conductivity by reducing the phonon mean free path. However, such contribution to the reduction of thermal conductivity was revealed to be as much as 30%. The feather-like structure was introduced because diffusion and sintering during deposition were suppressed by the addition of $La_2O_3$. On the other hand, it is apparent from the texture that the feather-like structure grows insufficiently and less effect of reducing the thermal conductivity is exerted because $La_2O_3$ is not added in Comparative Example 1. Thermal conductivity of the material of Example 1 of FIG. 4B is 0.5 W/mK, and thermal conductivity of the material of Comparative Example 1 of FIG. 4A is 1.4 W/mK.

Figure 5:
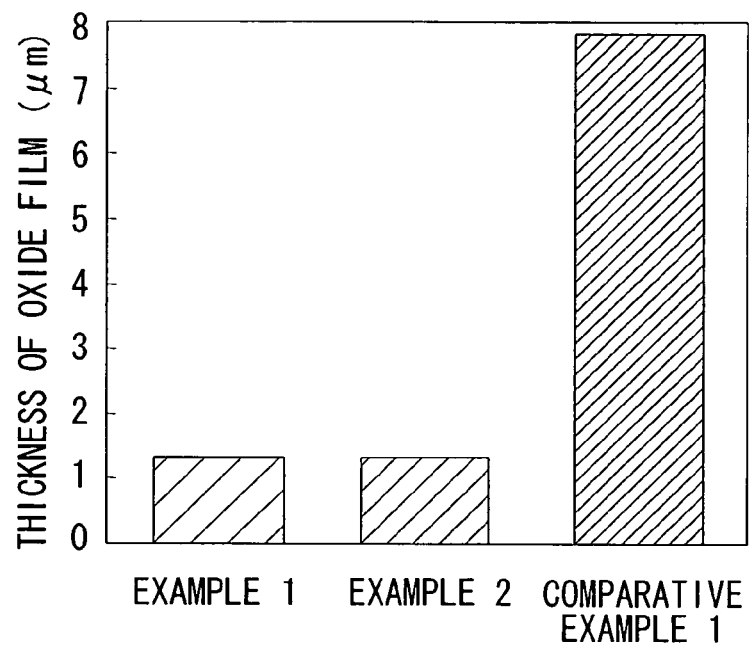
FIG. 5 is a graph showing a comparison in thickness of an oxide layer formed on a metal bonding layer made of a CoNiCrAlY alloy after a burner rig test between thermal barrier coating systems of Example 1 and Comparative Example 1.

FIG. 5 is a graph showing a comparison in thickness of an oxide layer formed on a metal bonding layer made of a CoNiCrAlY alloy after a burner rig test between thermal barrier coating systems of Examples 1 and 2 and Comparative Example 1. It has been confirmed that the oxide layer has a small thickness in Examples 1 and 2 and oxidation caused less damage. This is because the ceramics thermal barrier layer has low thermal conductivity in Example 1 and thus the surface temperature of the metal bonding layer made of a CoNiCrAlY alloy could be reduced as compared with Comparative Example 1. According to these Examples, the surface temperature of the substrate can be reduced by imparting low thermal conductivity to the ceramics thermal barrier layer, thus making it possible to markedly extend the lifetime up to spalling.

Example 9

In Example 9, a turbine blade provided with a thermal barrier coating (thermal barrier coating system) was manufactured by forming a metal bonding layer 2 made of PtAl on the surface of a turbine blade for gas turbine engine (metal substrate 1), and forming a thermal barrier coating layer 3 (porosity: about 25%) having orientation in the (001) direction on the surface of the metal bonding layer 2 by an electron beam physical vapor deposition method (EB-PVD method) using a $ZrO_2$-4 mol % (7 mass %)$Y_2O_3$ deposition material containing 5 mol % of $La_2O_3$ as a raw material.

Comparative Example 5

In Comparative Example 5, a turbine blade provided with a thermal barrier coating (thermal barrier coating system) of Comparative Example 5 was manufactured by forming a metal bonding layer 2 made of PtAl on the surface of the same turbine blade (metal substrate 1) as that used in Example 9, and forming a thermal barrier coating layer 4 (porosity: about 25%) having orientation in the (001) direction on the surface of the same metal bonding layer 2 by an EB-PVD method using a $ZrO_2$-4 mol % (7 mass %)$Y_2O_3$ deposition material containing no La component as a raw material.

Figure 6:
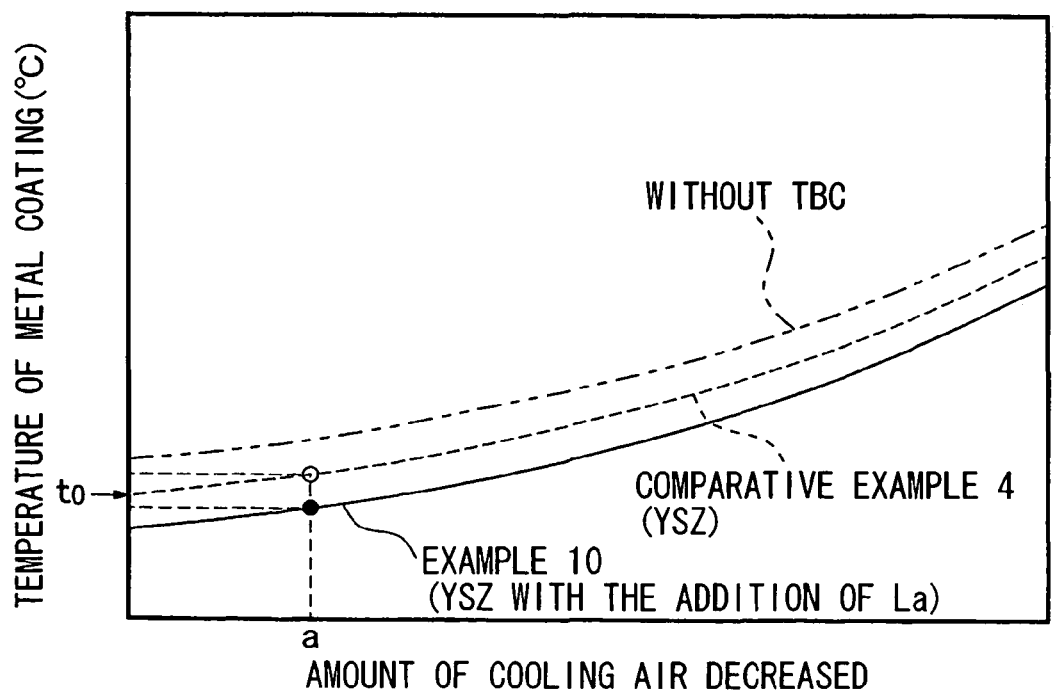
FIG. 6 is a graph showing a comparison in thermal barrier properties of a turbine blade between Example 10 and Comparative Example 5.

FIG. 6 shows the results (plots in the graph) obtained by measuring the surface temperature of a metal bonding layer 2 while feeding a cooling air inside the turbine blades manufactured in Example 9 and Comparative Example 5 in a high-temperature gas at 1050° C. When the turbine blade is provided with the thermal barrier coating layer, the size of a cooling hole of the blade decreases as a result of the deposition of the coating, and thus amount of the cooling air decreases. In FIG. 6, the curves show the temperature changes at metal layer 2 estimated from the effect of amount of cooling air decrease (X-axis). As is apparent from the same graph, in the case of Comparative Example 5, the cooling air amount decreases, and the metal temperature exceeds a target temperature to, and thus the cooling holes must be retrimmed after coating. In contrast, in the turbine blade of Example 9, the temperature of the metal portion was sufficiently lower than the target temperature even after coating. From this result, in the case in which the thermal barrier coating layer of the present invention is formed, it is made possible to achieve a sufficiently low temperature on the metal surface without performing complex processes such as retrimming of cooling holes.

What is claimed is:

1. A thermal baffler coating system comprising a metal substrate, a metal bonding layer, and a ceramic thermal baffler layer formed on the surface of the metal substrate via the metal bonding layer by an electron beam physical vapor deposition method, wherein the ceramic thermal baffler layer contains 0.1 to 10 mol % of lanthanum oxide, and has a columnar structure of a stabilized zirconia containing a stabilizer, and the ceramic thermal barrier layer has a composition represented by the general formula:

$(Zr_\alpha)O_2$-$\beta$ mol % $(M_2O_3)$-$\gamma$ mol % $(La_2O_3)$ (wherein $M_2O_3$ is the stabilizer and M consists of at least one element selected from Y, Er, Gd, Yb, Ce, Nd, Pr and Sc, and $\alpha$, $\beta$ and $\gamma$ are coefficients) and the coefficients $\alpha$, $\beta$ and $\gamma$ satisfy the relationships: $\alpha=1$, $3.1 \leq \beta \leq 15$, and $0.1 \leq \gamma \leq 10$.

2. The thermal barrier coating system according to claim 1, wherein the metal bonding layer is made of one of an MCrAlY alloy (wherein that M is at least one kind of metal selected from Ni, Co, Fe, and an alloy thereof) and platinum aluminide.

3. The thermal baffler coating system according to claim 1, wherein the metal substrate, on which the ceramic thermal baffler layer is formed via the metal bonding layer, is gas turbine part.

4. The thermal baffler coating system according to claim 3, wherein the gas turbine part is at least one selected from the group consisting of a turbine nozzle vane, a turbine blade and combustion chamber parts.

5. A thermal barrier coating system comprising a metal substrate, a metal bonding layer, and a ceramic thermal barrier layer formed on the surface of the metal substrate via the metal bonding layer by an electron beam physical vapor deposition method, wherein the ceramic thermal barrier layer contains 0.1 to 10 mol % of lanthanum oxide, and has a columnar structure of stabilized zirconia-hafnia solid solution containing a stabilizer, and $(Zr_\alpha Hf_{1-\alpha}) O_2$-$\beta$ mol % $(M_2O_3)$-$\gamma$ mol % $(La_2O_3)$ (wherein $M_2O_3$ is the stabilizer and M consists of at least one element selected from Y, Er, Gd, Yb, Ce, Nd, Pr and Sc, and $\alpha$, $\beta$ and $\gamma$ are coefficients) and $\alpha$, $\beta$ and $\gamma$ satisfy the relationships: $0.05 < \alpha < 1$, $3.1 \leq \beta \leq 15$, and $0.1 \leq \gamma \leq 10$.

6. The thermal barrier coating system according to claim 5, wherein the metal bonding layer is made of one of an MCrAlY alloy (wherein that M is at least one kind of metal selected from Ni, Co, Fe, and an alloy thereof) and platinum aluminide.

7. The thermal barrier coating system according to claim 5, wherein the metal substrate, on which the ceramic thermal baffler layer is formed via the metal bonding layer, is gas turbine part.

8. The thermal baffler coating system according to claim 7, wherein the gas turbine part is at least one selected from the group consisting of a turbine nozzle vane, a turbine blade and combustion chamber parts.

9. A thermal barrier coating system comprising a metal substrate, a metal bonding layer, and a ceramic thermal barrier layer formed on the surface of the metal substrate via the metal bonding layer by an electron beam physical vapor deposition method, wherein the ceramic thermal barrier layer contains 0.1 to 10 mol % of lanthanum oxide, and has a columnar structure of a stabilized zirconia containing a stabilizer, and the stabilizer contained in the ceramic thermal barrier layer is at least one kind of an oxide selected from the group consisting of erbium oxide, gadolinium oxide, ytterbium oxide, neodymium oxide, praseodymium oxide, cerium oxide and scandium oxide.

10. A thermal barrier coating system comprising a metal substrate, a metal bonding layer, and a ceramic thermal barrier layer formed on the surface of the metal substrate via the metal bonding layer by an electron beam physical vapor deposition method, wherein the ceramic thermal barrier layer contains 0.1 to 10 mol % of lanthanum oxide, and has a columnar structure of a stabilized zirconia containing a stabilizer, and the ceramic thermal barrier layer is composed of a plurality of columnar grains grown vertically from the surface of the metal substrate and having an orientation in the direction of the <100> or <001> plane, laminar or bar-shaped subgrains being arranged on the surface of the columnar grains, and nano-size pores being formed in each columnar grain, and wherein the ceramic thermal barrier layer has a porosity of 10 to 50% by volume.

11. A thermal barrier coating system according to claim 10, wherein the content of the stabilizer is between about 3-15 mol %.

12. A thermal barrier coating system according to claim 10, wherein the stabilizer contained in the ceramic thermal barrier layer is at least one kind of an oxide selected from the group consisting of erbium oxide, ytterbium oxide and praseodymium oxide.

13. A thermal barrier coating system comprising a metal substrate, a metal bonding layer, and a ceramic thermal baffler layer formed on the surface of the metal substrate via the metal bonding layer by an electron beam physical vapor deposition method, wherein the ceramic thermal baffler layer contains 0.1 to 10 mol % of lanthanum oxide, and has a columnar structure of stabilized zirconia-hafnia solid solution containing a stabilizer, and the stabilizer contained in the ceramic thermal baffler layer is at least one kind of an oxide selected from the group consisting of erbium oxide, gadolinium oxide, ytterbium oxide, neodymium oxide, praseodymium oxide, cerium oxide and scandium oxide.

14. A thermal barrier coating system comprising a metal substrate, a metal bonding layer, and a ceramic thermal barrier layer formed on the surface of the metal substrate via the metal bonding layer by an electron beam physical vapor deposition method, wherein the ceramic thermal barrier layer contains 0.1 to 10 mol % of lanthanum oxide and has a columnar structure of stabilized zirconia-hafnia solid solution containing a stabilizer, and is composed of a plurality of columnar grains extending vertically from the surface of the metal substrate and having an orientation in the direction of at least one of the <100> and <001> plane, laminar or bar-shaped subgrains being arranged on the surface of the columnar grains, and nano-size pores being formed in each columnar grain, and wherein the ceramic thermal barrier layer has a porosity of 10 to 50% by volume.

15. A thermal barrier coating system according to claim 14, wherein the content of the stabilizer is between about 3-15 mol %.

16. A thermal barrier coating system according to claim 14, wherein the stabilizer contained in the ceramic thermal barrier layer is at least one kind of an oxide selected from the group consisting of erbium oxide, ytterbium oxide and praseodymium oxide.

* * * * *